United States Patent
Gao et al.

(10) Patent No.: US 11,264,701 B1
(45) Date of Patent: Mar. 1, 2022

(54) METHOD FOR MANUFACTURING AN ANTENNA PRINTED CIRCUIT BOARD

(71) Applicants: Avary Holding (Shenzhen) Co., Limited., Shenzhen (CN); QING DING PRECISION ELECTRONICS (HUAIAN) CO., LTD, Huai an (CN)

(72) Inventors: Zi-Qiang Gao, Shenzhen (CN); Chih-Wen Cheng, New Taipei (TW); Ke He, Shenzhen (CN); Xian-Qin Hu, Shenzhen (CN)

(73) Assignees: Avary Holding (Shenzhen) Co., Limited., Shenzhen (CN); QING DING PRECISION ELECTRONICS (HUAIAN) CO., LTD, Huai an (CN)

( * ) Notice: Subject to any disclaimer, the term of this patent is extended or adjusted under 35 U.S.C. 154(b) by 25 days.

(21) Appl. No.: 17/027,936

(22) Filed: Sep. 22, 2020

(30) Foreign Application Priority Data

Aug. 25, 2020 (CN) .......................... 202010865777.X

(51) Int. Cl.
*H01Q 1/38* (2006.01)
*H01Q 1/22* (2006.01)

(52) U.S. Cl.
CPC ......... *H01Q 1/2283* (2013.01); *H01Q 1/2291* (2013.01); *H01Q 1/38* (2013.01)

(58) Field of Classification Search
CPC ...... H01Q 1/2283; H01Q 1/2291; H01Q 1/38; H01Q 21/065; H01Q 9/0407; H05K 1/189; H05K 2201/056; H05K 3/4691
See application file for complete search history.

(56) References Cited

U.S. PATENT DOCUMENTS

| | | | |
|---|---|---|---|
| 2019/0189606 A1* | 6/2019 | Kamphuis | H01Q 1/2283 |
| 2020/0021015 A1* | 1/2020 | Yun | H01Q 25/00 |
| 2020/0028239 A1 | 1/2020 | So et al. | |
| 2021/0013587 A1* | 1/2021 | Li | H01Q 1/38 |
| 2021/0066783 A1* | 3/2021 | Wu | H01Q 1/2283 |

FOREIGN PATENT DOCUMENTS

TW I699864 B 7/2020

* cited by examiner

*Primary Examiner* — David E Lotter
(74) *Attorney, Agent, or Firm* — ScienBiziP, P.C.

(57) ABSTRACT

A method for manufacturing an antenna printed circuit board includes the following steps: providing a flexible-rigid printed circuit board comprising a flexible region and a rigid region. The flexible region comprises at least one first connecting pad and at least one second connecting pad arranged opposite sides of the rigid region. At least one antenna module is attached to the first connecting pad through a conductive paste. The antenna module is fixed on the rigid region by a first reflow soldering process. At least one radio frequency integrated circuit structure is attached to the second connecting pad through a conductive paste. The radio frequency integrated circuit is fixed on the rigid region by a second reflow soldering process. A gap between the antenna module and the rigid region and a gap between the radio frequency integrated circuit structure and the rigid region are filled with dielectric materials and cured.

10 Claims, 11 Drawing Sheets

US 11,264,701 B1

METHOD FOR MANUFACTURING AN ANTENNA PRINTED CIRCUIT BOARD

FIELD

The subject matter herein generally relates to printed circuit boards, in particular to a method for manufacturing an antenna printed circuit board.

BACKGROUND

With the development of the 5th generation wireless systems, radio frequency integrated circuit structure and antenna module need to be integrated into the circuit board. This would result in an increase in a heat of the circuit board, and the heat of the circuit board is difficult to dissipate.

Therefore, there is room for improvement within the art.

BRIEF DESCRIPTION OF THE DRAWINGS

Implementations of the present disclosure will now be described, by way of embodiments, with reference to the attached figures.

DETAILED DESCRIPTION

Figure 1:
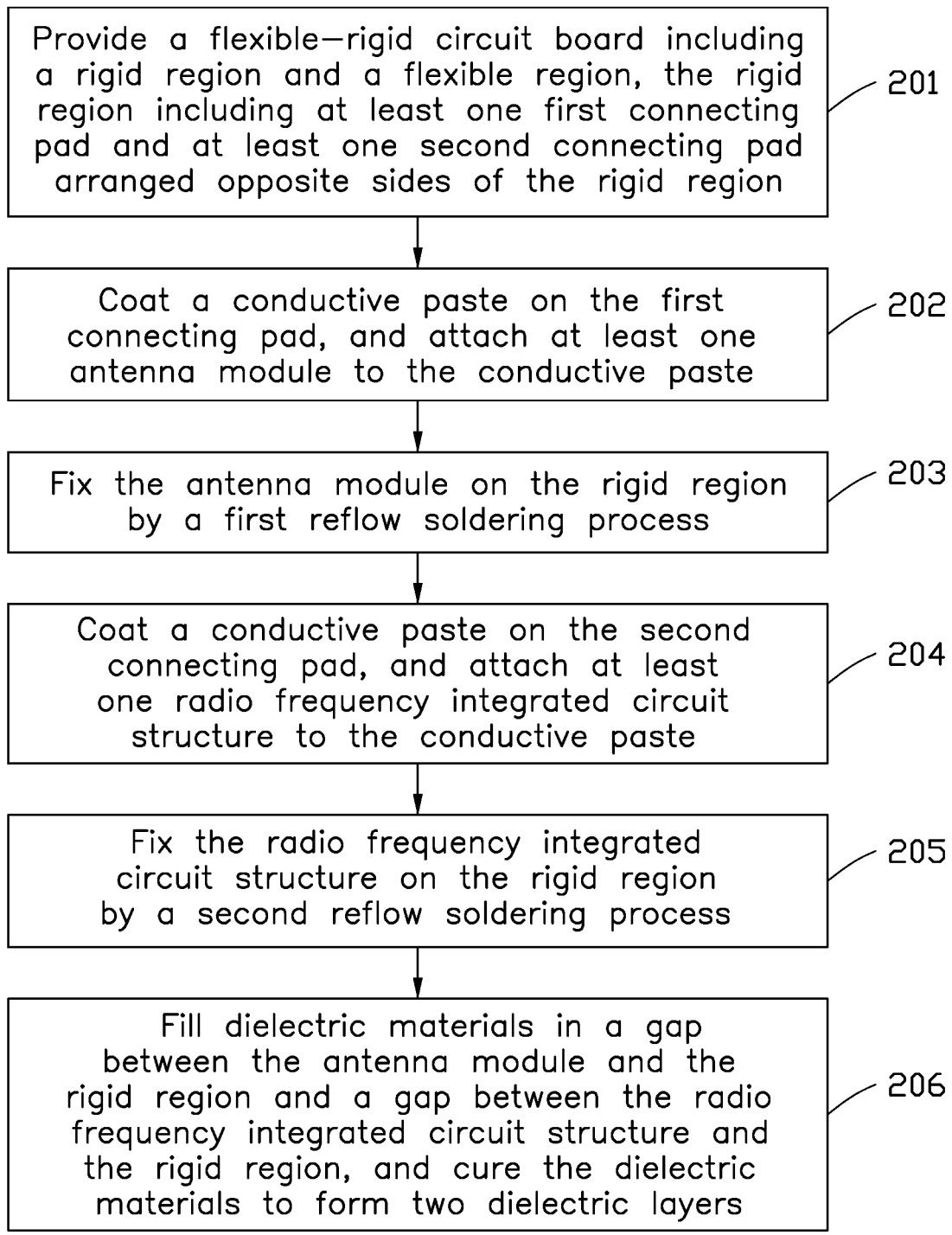
FIG. 1 is a flowchart of an embodiment of a method for manufacturing an antenna printed circuit board.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 illustrates a flowchart of a method in accordance with an embodiment. The method for manufacturing an antenna printed circuit board 100 (shown in FIG. 7) is provided by way of embodiments, as there are a variety of ways to carry out the method. Each block shown in FIG. 1 represents one or more processes, methods, or subroutines carried out in the method. Furthermore, the illustrated order of blocks can be changed. Additional blocks may be added or fewer blocks may be utilized, without departing from this disclosure. The method can begin at block 201.

Figure 2:
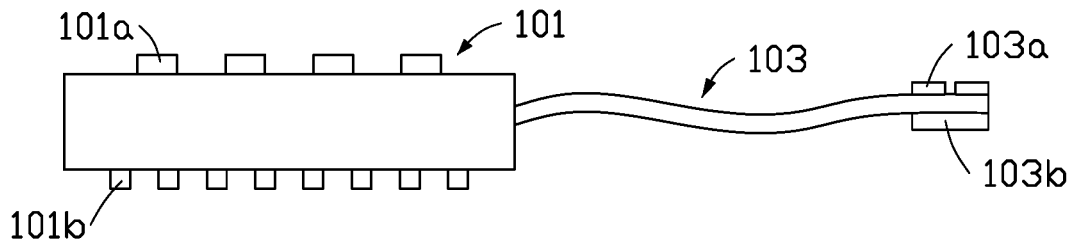
FIG. 2 is a cross-sectional view of an embodiment of a flexible-rigid printed circuit board.

At block 201, referring to FIG. 2, a flexible-rigid printed circuit board 10 is provided. The flexible-rigid printed circuit board 10 includes a rigid region 101 and a flexible region 103 connecting the rigid region 101. The rigid region 101 includes at least one exposed first connecting pad 101a and at least one exposed second connecting pad 101b. The first connecting pad 101a and the second connecting pad 101b are arranged opposite sides of the rigid region 101.

In at least one embodiment, the flexible region 103 may include at least one exposed third connecting pad 103a. In at least one embodiment, the third connecting pad 103a and the first connecting pad 101a may be located on the same side of the flexible-rigid printed circuit board 10. In at least one embodiment, the third connecting pad 103a and the second connecting pad 101b may be located on the same side of the flexible-rigid printed circuit board 10. In at least one embodiment, when the flexible region 103 includes a plurality of third connecting pads 103a, a part of the plurality of third connecting pads 103a and the first connecting pad 101a are located the same side of the flexible-rigid printed circuit board 10, another part of the plurality of third connecting pads 103a and the second connecting pad 101b are located the same side of the flexible-rigid printed circuit board 10.

At least one stiffening plate 103b may be formed on the flexible region 103. The stiffening plate 103b corresponds to the third connecting pad 103a, each of the at least one stiffening plate 103b and the corresponding third connecting pad 103a is located opposite sides of the flexible region 103.

In at least one embodiment, the stiffening plate 103b may be a steel plate.

In this embodiment, the third connecting pad 103a and the first connecting pad 101a are located on the same side of the flexible-rigid printed circuit board 10. The stiffening plate 103b and the second connecting pad 101b are located on the same side of the flexible-rigid printed circuit board 10.

Figure 3:
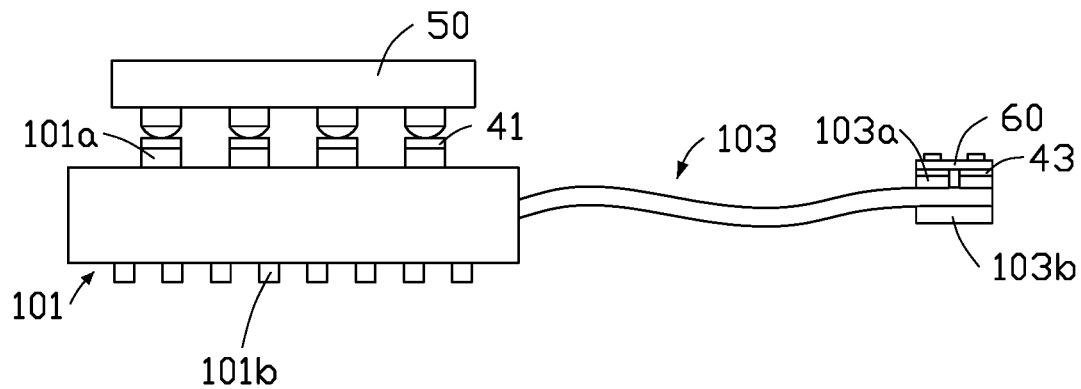
FIG. 3 is a cross-sectional view showing at least one antenna module attached to the flexible-rigid printed circuit board of FIG. 2 through a conductive paste.

At block 202, referring to FIG. 3, a conductive paste 41 is coated on the first connecting pad 101a, and at least one antenna module 50 is attached to the conductive paste 41 to electrically connect the antenna module 50 and the rigid region 101 of the flexible-rigid printed circuit board 10.

In at least one embodiment, a conductive paste 43 may be coated on the third connecting pad 103a on the same side as the first connecting pad 101a, and at least one electronic component 60 is attached to the conductive paste 43 to electrically connect the electronic component 60 and the flexible region 103 of the flexible-rigid printed circuit board 10.

In at least one embodiment, the conductive paste 41 and the conductive paste 43 may be solder paste. The conductive paste 41 and the conductive paste 43 may be formed by printing.

In at least one embodiment, before attaching the antenna module 50 and the electronic component 60 to the flexible-rigid printed circuit board 10, a conductive paste may be formed on at least one connector of the antenna module 50 for bonding with the flexible-rigid printed circuit board 10 and at least one connector of the electronic component 60 for bonding with the flexible-rigid printed circuit board 10.

Figure 4:
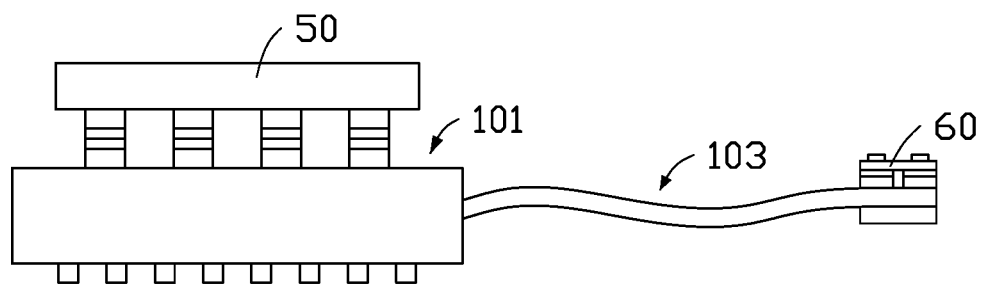
FIG. 4 is a cross-sectional view showing the antenna module fixed on the flexible-rigid printed circuit board of FIG. 3.

At block 203, referring to FIG. 4, the antenna module 50 is fixed on the rigid region 101 of the flexible-rigid printed circuit board 10 by a first reflow soldering process.

In at least one embodiment, the electronic component 60 on the same side as the antenna module 50 may also be fixed on the flexible region 103 of the flexible-rigid printed circuit board 10 by the first reflow soldering process.

Figure 5:
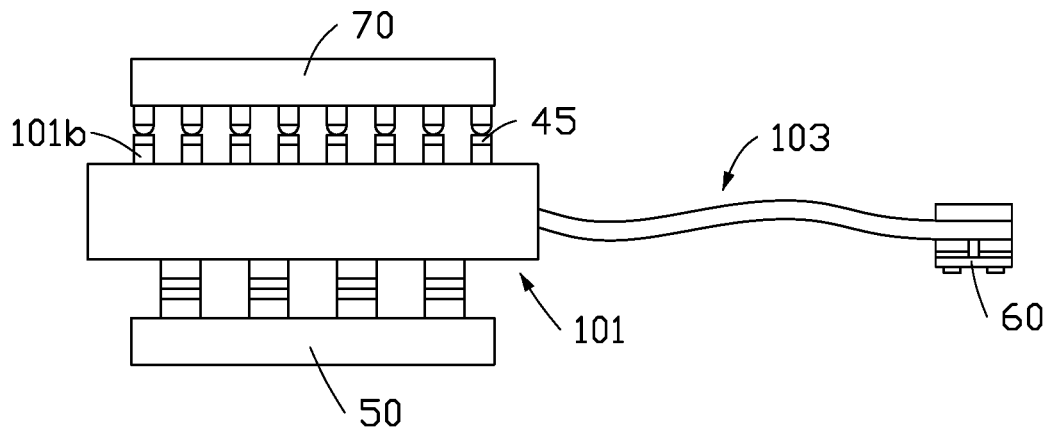
FIG. 5 is a cross-sectional view showing at least one radio frequency integrated circuit structure attached to the flexible-rigid printed circuit board of FIG. 4 through a conductive paste.

At block 204, referring to FIG. 5, a conductive paste 45 is coated on the second connecting pad 101b, and at least one radio frequency integrated circuit structure 70 is attached to the conductive paste 45 to electrically connect the radio frequency integrated circuit structure 70 and the rigid region 101 of the flexible-rigid printed circuit board 10.

In at least one embodiment, conductive paste 43 may be coated on the third connecting pad 103a on the same side as the second connecting pad 101b, and at least one electronic component 60 is attached to the conductive paste 43 to electrically connect the electronic component 60 and the flexible region 103 of the flexible-rigid printed circuit board 10.

In at least one embodiment, the conductive paste 45 may be solder paste. The conductive paste 45 may be formed by printing.

Figure 6:
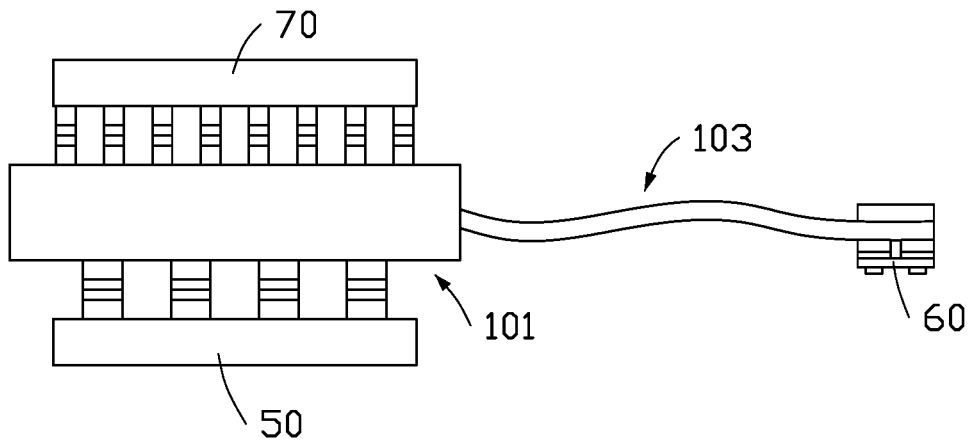
FIG. 6 is a cross-sectional view showing the radio frequency integrated circuit structure fixed on the flexible-rigid printed circuit board of FIG. 5.

At block 205, referring to FIG. 6, the radio frequency integrated circuit structure 70 is fixed on the rigid region 101 of the flexible-rigid printed circuit board 10 by a second reflow soldering process.

In at least one embodiment, the electronic component 60 on the same side as the radio frequency integrated circuit structure 70 may also be fixed on the flexible region 103 of the flexible-rigid printed circuit board 10 at the same time by the second reflow soldering process for fixing the radio frequency integrated circuit structure 70.

Figure 7:
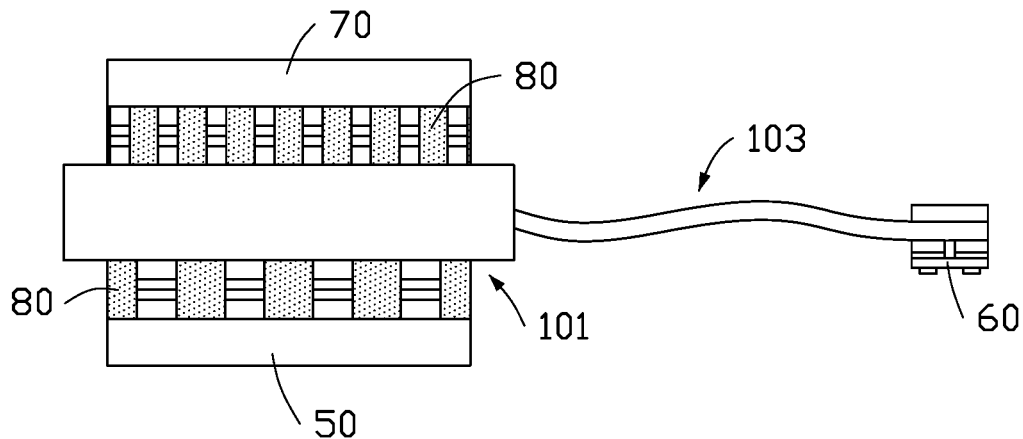
FIG. 7 is a cross-sectional view of an embodiment of an antenna printed circuit board.

At block 206, referring to FIG. 7, a gap between the antenna module 50 and the rigid region 101 of the flexible-rigid printed circuit board 10 and a gap between the radio frequency integrated circuit structure 70 and the rigid region 101 of the flexible-rigid printed circuit board 10 are filled with dielectric materials, and the dielectric materials are cured to form two dielectric layers, thereby obtaining the antenna printed circuit board 100.

The radio frequency integrated circuit structure 70 and the antenna module 50 are arranged on opposite sides of the rigid region 101 of the flexible-rigid printed circuit board 10, which facilitates heat dissipation, thereby helping to extend a service life of the antenna printed circuit board. the independent arrangement of the radio frequency integrated circuit structure 70 and the antenna module 50 facilitates the determination of the failed element and the replacement of the element when the antenna printed circuit board fails.

Figure 8:
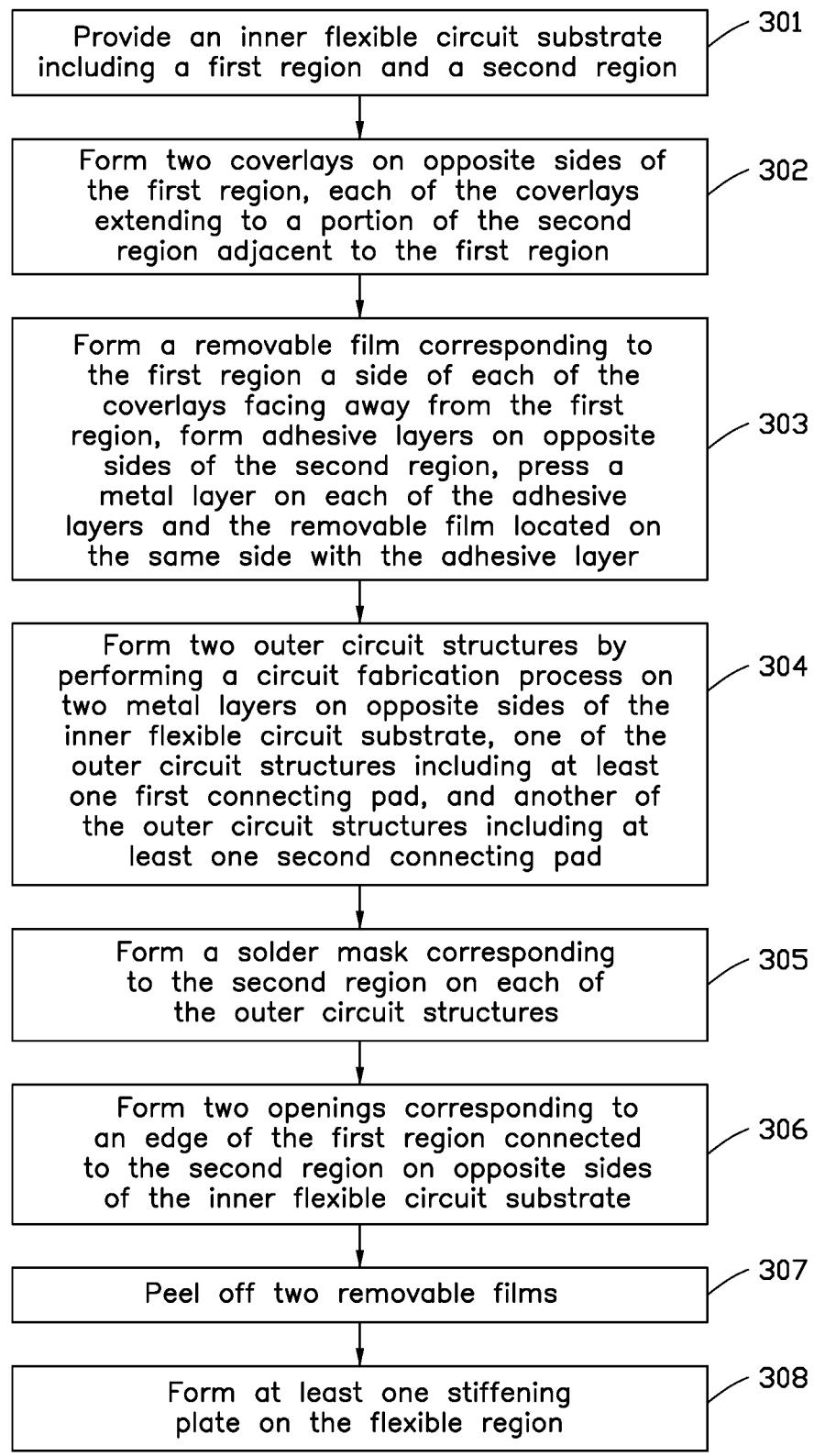
FIG. 8 is a flowchart of an embodiment of a method for manufacturing a flexible-rigid printed circuit board.

FIG. 8 illustrates a flowchart of an embodiment of a method for manufacturing the flexible-rigid printed circuit board 10. The method can begin at block 301.

Figure 9:
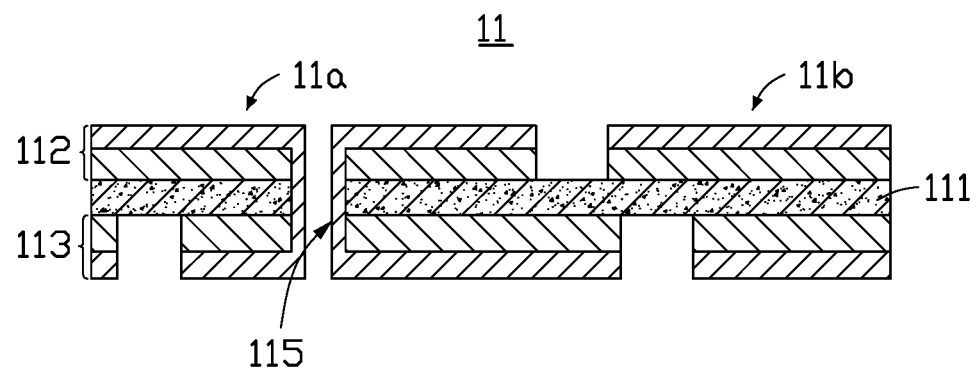
FIG. 9 is a cross-sectional view of an embodiment of an inner flexible circuit substrate.

At block 301, referring to FIG. 9, an inner flexible circuit substrate 11 is provided. The inner flexible circuit substrate 11 includes a first region 11a and a second region 11b connecting the first region 11a.

The inner flexible circuit substrate 11 includes a wiring layer, and may be a single-sided circuit board, double-sided circuit board, or multilayer circuit board. In at least one embodiment, the inner flexible circuit substrate 11 is a double-sided circuit board and includes a base 111, a first wiring layer 112, and a second wiring layer 113. The first wiring layer 112 and the second wiring layer 113 are located opposite sides of the base 111, and electrically connected by a conductive via 115.

Figure 10:
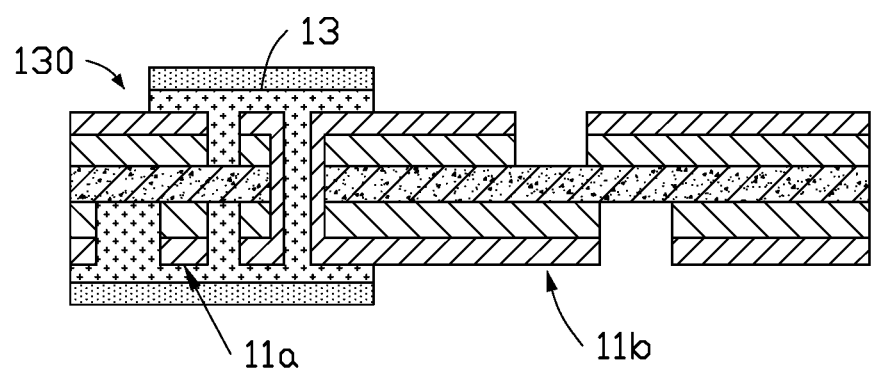
FIG. 10 is a cross-sectional view showing two coverlays on the inner flexible circuit substrate of FIG. 9.
Figure 11:
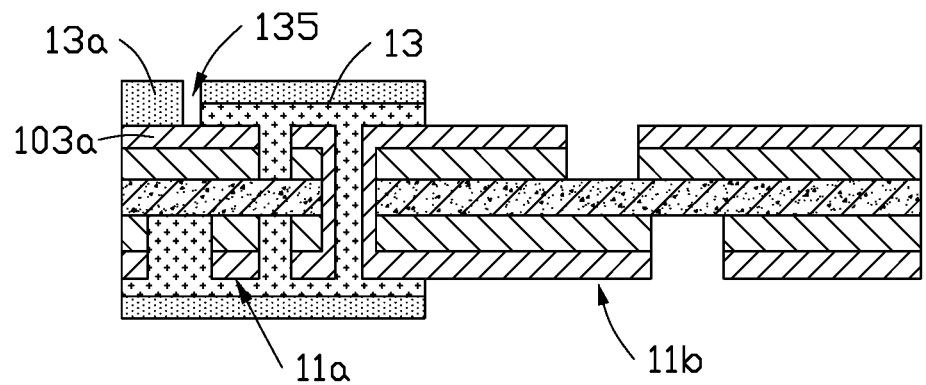
FIG. 11 is a cross-sectional view showing a solder mask in a groove of coverlays of FIG. 10.

At block 302, referring to FIGS. 10 and 11, two coverlays 13 respectively cover opposite sides of the first region 11a, and each of the coverlays 13 extends to a portion of the second region 11b adjacent to the first region 11a. At least one groove 130 is defined on at least one of the coverlays 13 to expose a portion of the first region 11a. At least one solder mask 13a is received in each groove 130, and a gap 135 is defined between each solder mask 13a and the coverlays 13 to expose a part of at least one wiring of the first region 11a as a third connecting pad 103a.

In at least one embodiment, the at least one groove 130 and the solder mask 13a may be omitted. That is, the first region 11a may not include any exposed connecting pads.

Figure 12:
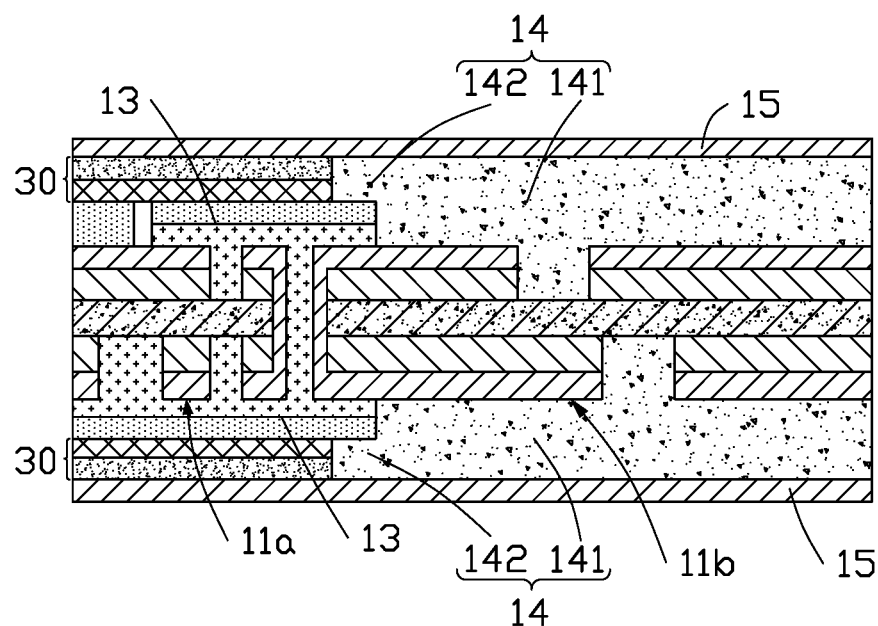
FIG. 12 is a cross-sectional view showing removable films, adhesive layers and metal layers on the inner flexible circuit substrate of FIG. 11.

At block 303, referring to FIG. 12, a removable film 30 corresponding to the first region 11a is bonded to a side of each of the coverlays 13 facing away from the first region 11a. Adhesive layers 14 are formed on opposite sides of the second region 11b. A metal layer 15 is pressed on a side of each of the adhesive layers 14 facing away from the inner flexible circuit substrate 11 and a side of the removable film 30 located on the same side with the adhesive layer 14 facing away from the inner flexible circuit substrate 11. Each of the adhesive layers 14 includes a first portion 141 directly formed on a surface of the second region 11b and a second portion 142 formed on a portion of one of the coverlays 13 located on the same side with the adhesive layer 14. The portion of one of the coverlays 13 is located on the second region 11b.

Figure 13:
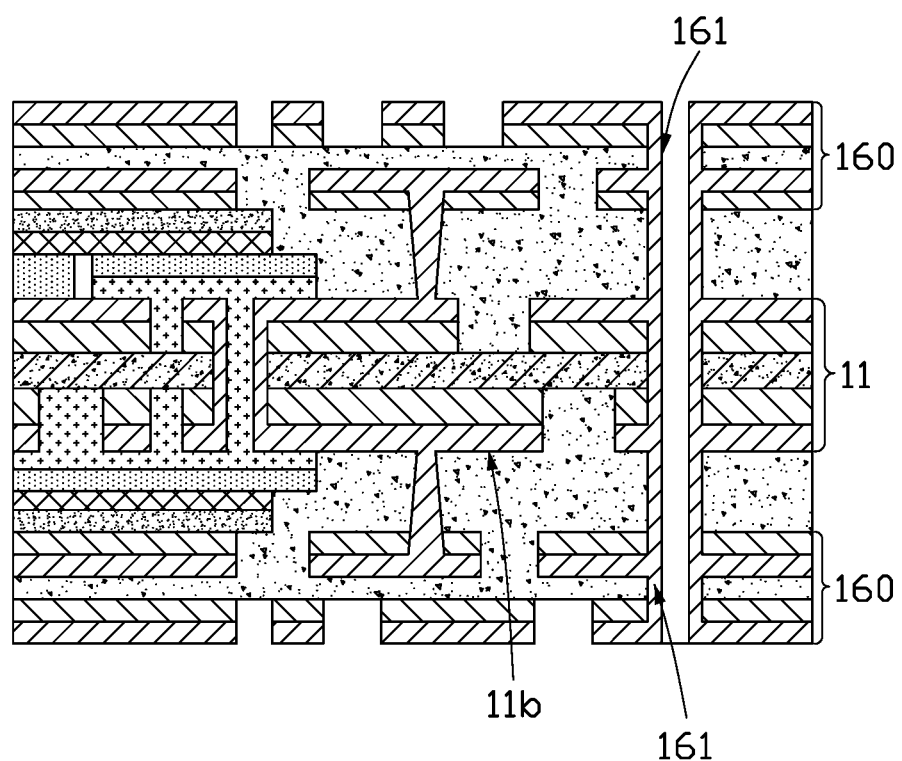
FIG. 13 is a cross-sectional view showing two outer circuit structures on the inner flexible circuit substrate of FIG. 12.

At block 304, referring to FIG. 13, two outer circuit structures 160 are formed on opposite sides of the inner flexible circuit substrate 11 by performing a circuit fabrication process on two metal layers 15 on opposite sides of the inner flexible circuit substrate 11. One of the outer circuit structures 160 includes at least one exposed first connecting pad 101a (shown in FIG. 2), and another of the outer circuit structures 160 includes at least one exposed second connecting pad 101b (shown in FIG. 2). The first connecting pad 101a and the second connecting pad 101b correspond to the second region 11b.

In at least one embodiment, the block 304 may further include forming a conductive via 161 sequentially penetrating one of the outer circuit structures 160, one of the adhesive layers 14, the inner flexible circuit substrate 11, another of the adhesive layers 14, and another of the outer circuit structures 160, thereby electrically connecting the outer circuit structures 160 and the inner flexible circuit substrate 11.

Each of the outer circuit structures 160 may be a single-layer circuit structure, a double-layer circuit structure, or a multilayer circuit structure.

In this embodiment, each of the outer circuit structures 160 is a double-layer circuit structure.

Figure 14:
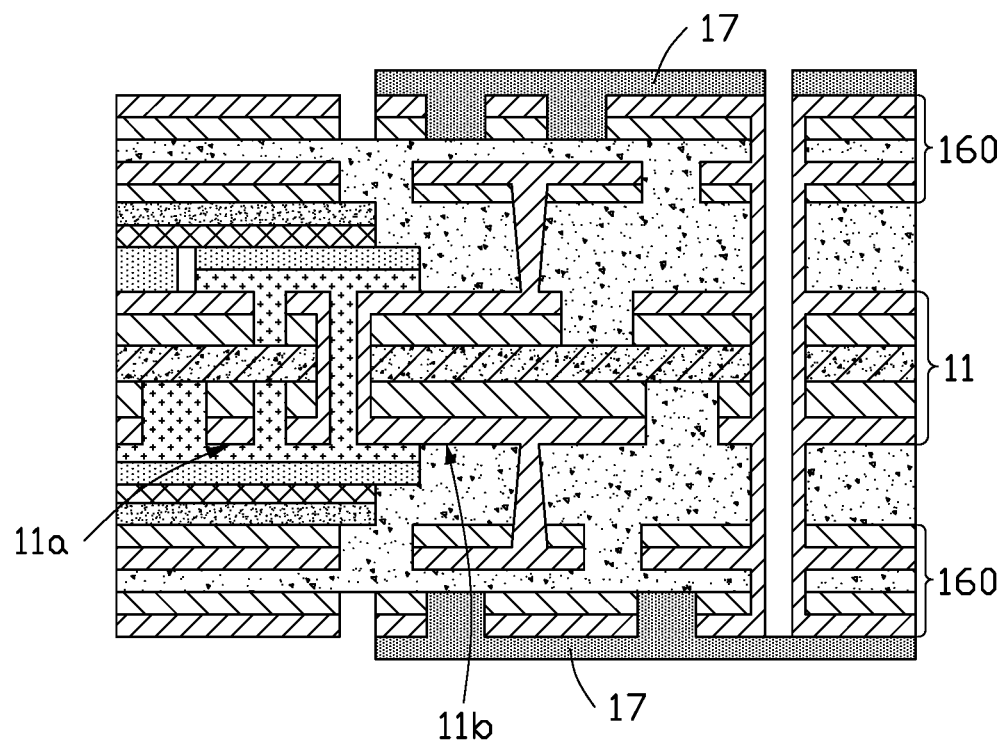
FIG. 14 is a cross-sectional view showing a solder mask on the outer circuit structures of FIG. 13.

At block 305, referring to FIG. 14, a solder mask 17 corresponding to the second region 11b is formed on a side of each of the outer circuit structures 160 facing away from the inner flexible circuit substrate 11. The at least one first connecting pad 101a (shown in FIG. 2) and the at least one second connecting pad 101b (shown in FIG. 2) are exposed from the solder mask 17.

Figure 15:
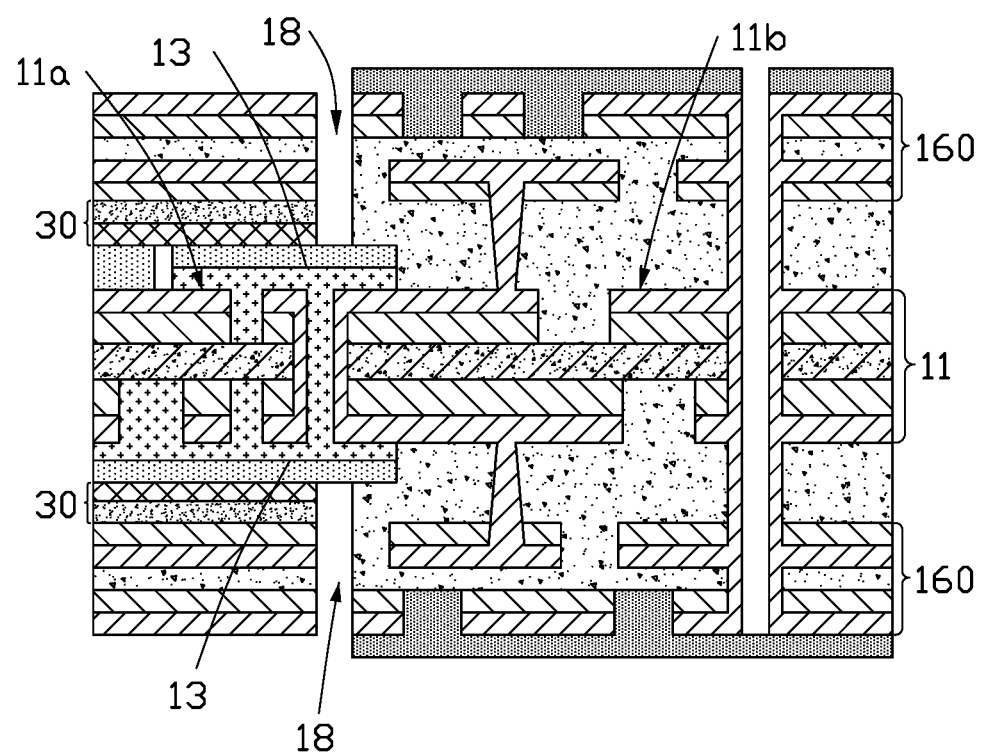
FIG. 15 is a cross-sectional view showing openings on opposite sides of the inner flexible circuit substrate of FIG. 14.

At block 306, referring to FIG. 15, two openings 18 corresponding to an edge of the first region 11a connected to the second region 11b are respectively formed on opposite sides of the inner flexible circuit substrate 11 to penetrate one of the outer circuit structures 160 and the removable film 30 adjacent to the outer circuit structure 160.

In at least one embodiment, the openings 18 may be formed by cutting.

Figure 16:
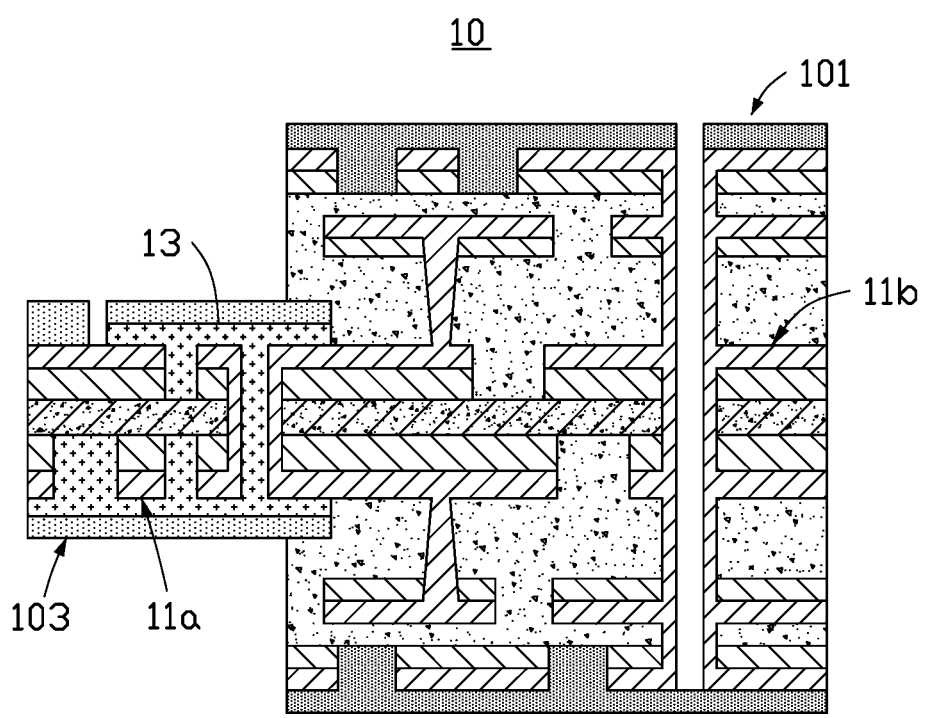
FIG. 16 is a cross-sectional view of an embodiment of a flexible-rigid printed circuit board.

At block 307, referring to FIG. 16, two removable films 30 is peeled off along the openings 18 to expose a portion of the coverlays 13 corresponding to the first region 11a, thereby obtaining a flexible-rigid printed circuit board 10. A region of the flexible-rigid printed circuit board 10 corresponding to the first region 11a is a flexible region 103, and a region of the flexible-rigid printed circuit board 10 corresponding to the second region 11b is a rigid region 101.

In at least one embodiment, the method for manufacturing the flexible-rigid printed circuit board 10 may further include block 608.

Figure 17:
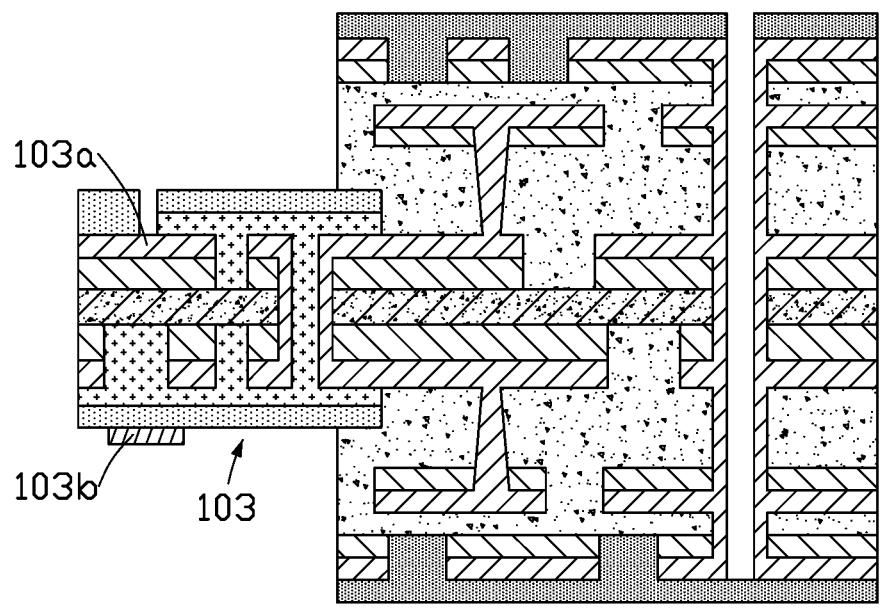
FIG. 17 is a cross-sectional view of another embodiment of a flexible-rigid printed circuit board.

At block 308, referring to FIG. 17, at least one stiffening plate 103b are formed on the flexible region 103. Each stiffening plate 103b corresponds to the at least one third connecting pad 103a, and one of the at least one stiffening plate 103b and the at least one corresponding third connecting pad 103a are located opposite sides of the flexible region 103.

In at least one embodiment, the third connecting pad 103a may be exposed from the coverlays 13 after peeling off the removable films 30.

Depending on the embodiment, certain of the steps of methods described may be removed, others may be added, and the sequence of steps may be altered. It is also to be understood that the description and the claims drawn to a method may include some indication in reference to sequential steps. However, the indication used is only to be viewed for identification purposes and not as a suggestion as to an order for the steps.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for manufacturing an antenna printed circuit board comprising: providing a flexible-rigid printed circuit board comprising a flexible region and a rigid region, wherein the rigid region comprises at least one exposed first connecting pad and at least one exposed second connecting pad, the at least one exposed first connecting pad and the at least one exposed second connecting pad are arranged opposite sides of the rigid region; forming a conductive paste on the at least one exposed first connecting pad, and attaching at least one antenna module to the conductive paste on the at least one exposed first connecting pad to electrically connect the at least one antenna module and the at least one exposed first connecting pad; fixing the at least one antenna module on the rigid region of the flexible-rigid printed circuit board by a first reflow soldering process; forming a conductive paste on the at least one exposed second connecting pad, and attaching at least one radio frequency integrated circuit structure to the conductive paste on the at least one exposed second connecting pad to electrically connect the at least one radio frequency integrated circuit structure and the rigid region of the flexible-rigid printed circuit board; fixing the at least one radio frequency integrated circuit structure on the rigid region of the flexible-rigid printed circuit board by a second reflow soldering process; and filling dielectric materials in a gap between the at least one antenna module and the rigid region of the flexible-rigid printed circuit board and a gap between the radio frequency integrated circuit structure and the rigid region of the flexible-rigid printed circuit board, and curing the dielectric materials to form two dielectric layers.

2. The method of claim 1, wherein the flexible region comprises at least one exposed third connecting pad, at least one stiffening plate corresponding to the at least one exposed third connecting pad is formed on the flexible region, each of the at least one stiffening plate and the at least one corresponding third exposed connecting pad are located opposite sides of the flexible region, the method further comprise: forming a conductive paste on the at least one exposed third connecting pad, and attaching at least one electronic component to the conductive paste on the at least one exposed third connecting pad to electrically connect the at least one electronic component and the flexible region of the flexible-rigid printed circuit board; fixing the at least one electronic component on the flexible region of the flexible-rigid printed circuit board by a third reflow soldering process.

3. The method of claim 2, wherein the at least one exposed first connecting pad and the at least one exposed third connecting pad are located the same side of the flexible-rigid printed circuit board.

4. The method of claim 3, wherein the at least one electronic component and the at least one antenna module are fixed on the flexible-rigid printed circuit board at the same time.

5. The method of claim 2, wherein the at least one exposed second connecting pad and the at least one exposed third connecting pad are located the same side of the flexible-rigid printed circuit board.

6. The method of claim 5, wherein the at least one electronic component and the at least one radio frequency integrated circuit structure are fixed on the flexible-rigid printed circuit board at the same time.

7. The method of claim 2, wherein at least one of the conductive paste on the at least one exposed first connecting pad, the conductive paste on the at least one exposed second connecting pad, and the conductive paste on the at least one exposed third connecting pad is formed on the flexible-rigid printed circuit board by printing, and is made of solder paste.

8. The method of claim 1, wherein a method for manufacturing the flexible-rigid printed circuit board comprising:
    providing an inner flexible circuit substrate comprising a first region and a second region connecting the first region;

forming two coverlays on opposite sides of the first region respectively, wherein each of the coverlays extends to a portion of the second region adjacent to the first region;

forming a removable film corresponding to the first region on a side of each of the coverlays facing away from the first region, forming two adhesive layers on opposite sides of the second region, and pressing a metal layer on each of the adhesive layers and the removable film located on the same side with the adhesive layer, wherein each of the adhesive layers comprises a first portion directly bonded to the second region and a second portion bonded to a portion of the coverlays located on the second region;

forming two outer circuit structures on opposite sides of the inner flexible circuit substrate by performing a circuit fabrication process on two metal layers on opposite sides of the inner flexible circuit substrate, wherein one of the outer circuit structures comprises at least one exposed first connecting pad, and another of the outer circuit structures comprises at least one exposed second connecting pad; the at least one exposed first connecting pad and the at least one exposed second connecting pad correspond to the second region;

forming two openings corresponding to an edge of the first region connected to the second region on opposite sides of the inner flexible circuit substrate respectively, wherein each of the openings penetrates one of the outer circuit structures and the removable film adjacent to the outer circuit structure; and peeling off two removable films along the openings to expose a portion of the coverlays corresponding to the first region, thereby obtaining a flexible-rigid printed circuit board, wherein a region of the flexible-rigid printed circuit board corresponding to the first region is a flexible region, and a region of the flexible-rigid printed circuit board corresponding to the second region is a rigid region.

9. The method of claim 8, wherein the inner flexible circuit substrate comprises at least one wiring, before forming the removable films, the adhesive layers and the metal layers, or after peeling off the removable films, the method for manufacturing the flexible-rigid printed circuit board further comprising:

forming at least one groove on the coverlays to a portion of the first region, and forming a solder mask in each of the at least one groove, thereby defining a gap between the coverlays and each solder mask in the at least one groove to expose a part of the at least wiring corresponding to the first region as a third connecting pad.

10. The method of claim 9, wherein after peeling off the removable films, the method for manufacturing the flexible-rigid printed circuit board further comprising: forming at least one stiffening plate on the flexible region, wherein each of the at least one stiffening plate corresponds to the at least one third connecting pad, and one of the at least one stiffening plate and the at least one corresponding third connecting pad are located opposite sides of the flexible region.

* * * * *